(12) United States Patent
Givens

(10) Patent No.: US 6,404,053 B2
(45) Date of Patent: *Jun. 11, 2002

(54) UTILIZATION OF ENERGY ABSORBING LAYER TO IMPROVE METAL FLOW AND FILL IN A NOVEL INTERCONNECT STRUCTURE

(75) Inventor: John H. Givens, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/282,385

(22) Filed: Mar. 31, 1999

Related U.S. Application Data

(62) Division of application No. 08/801,812, filed on Feb. 14, 1997.

(51) Int. Cl.[7] ............... H01L 23/48; H01L 23/52; H01L 29/40
(52) U.S. Cl. .................. 257/751; 257/763; 257/765
(58) Field of Search ................ 257/758, 751, 257/763, 765; 438/637

(56) References Cited

U.S. PATENT DOCUMENTS

| | | | | |
|---|---|---|---|---|
| 4,472,456 A | | 9/1984 | Shah | 427/53.1 |
| 4,700,465 A | | 10/1987 | Sirkin | 438/533 |
| 4,997,518 A | * | 3/1991 | Madokoro | 257/437 |
| 5,274,210 A | | 12/1993 | Freedman | 219/121.63 |
| 5,380,678 A | * | 1/1995 | Yu et al. | 438/627 |
| 5,391,517 A | * | 2/1995 | Gelatos et al. | 438/643 |
| 5,409,862 A | | 4/1995 | Wada et al. | 438/607 |
| 5,420,072 A | | 5/1995 | Fiordalice et al. | 438/607 |
| 5,578,523 A | | 11/1996 | Fiordalice et al. | 438/633 |
| 5,602,053 A | * | 2/1997 | Zheng et al. | 257/530 |
| 5,635,423 A | | 6/1997 | Huang et al. | 437/195 |
| 5,653,810 A | | 8/1997 | Kataoka et al. | 118/723 |
| 5,668,055 A | | 9/1997 | Xu et al. | 438/637 |
| 5,702,982 A | * | 12/1997 | Lee et al. | 438/620 |
| 5,821,620 A | * | 10/1998 | Hong | 257/751 |
| 5,824,599 A | * | 10/1998 | Schacham-Diamand et al. | 438/678 |
| 5,869,395 A | | 2/1999 | Yim | 438/637 |
| 5,956,612 A | * | 9/1999 | Elliott et al. | 438/637 |
| 6,069,068 A | * | 5/2000 | Rathore et al. | 438/628 |

FOREIGN PATENT DOCUMENTS

JP  01-302842  * 12/1989

* cited by examiner

*Primary Examiner*—Phat X. Cao
(74) *Attorney, Agent, or Firm*—Workman, Nydegger & Seeley

(57) ABSTRACT

Disclosed is a method for manufacturing an interconnect structure situated on a semiconductor wafer having a substrate assembly thereon. The interconnect structure is formed in a recess such as a trench, a hole, a via, or a combination of a trench and a hole or via within a dielectric material situated on the substrate assembly of the semiconductor wafer. At least one barrier layer is deposited within the recess. A seed layer helping to promote nucleation, deposition, and growth of a material that will be used to fill up the recess is then deposited on the barrier layer. An electrically conductive layer is then formed upon the seed layer. An energy absorbing layer will then be formed upon the conductor layer, where the energy absorbing layer has a greater thermal absorption capacity than that of the electrically conductive layer. The energy absorbing layer is heated, with or without an applied heightened pressure, to cause the conductor layer to flow so as to fill voids that have formed within the dielectric structure. Following the steps of heating or heating and pressurizing the energy absorbing layer, both the energy absorbing layer and a portion of the conductive layer situated above the dielectric structure are removed.

46 Claims, 1 Drawing Sheet

UTILIZATION OF ENERGY ABSORBING LAYER TO IMPROVE METAL FLOW AND FILL IN A NOVEL INTERCONNECT STRUCTURE

This is a divisional patent application of U.S. patent application Ser. No. 08/801,812, filed on Feb. 14, 1997, which is incorporated herein by reference.

BACKGROUND OF THE INVENTION

1. The Field of the Invention

The present invention relates to a metallized integrated circuit structure, and particularly to a metallized interconnect structure situated on a semiconductor substrate assembly and methods for making.

2. The Relevant Technology

Current technology for metallization of an integrated circuit involves the forming of a conductive layer over the integrated circuit. A typical metallization process is one that is performed at the "back end of the line" which is after the formation of integrated circuits that are to be wired by the metallization process. A single conductive layer is often formed so that it is situated above the integrated circuit to be wired. After the conductive layer is formed, it is then patterned and etched into a shape of the desired wiring necessary to metallize the integrated circuit. Since the conductive layer is situated above the integrated circuit, the resultant metallization will also be above the integrated circuit in a "wring up" scheme.

Another type of metallization involves the formation of a conductive layer at least in part below the integrated circuit in a recess composed of an electrically insulative or dielectric material. Such a wiring scheme may be described as a "wiring down" scheme. The recess can be either a trench, a hole, or a via. Depending upon the aspect ratio of the recess, poor step coverage of the conductive layer within the recess may result. Voids in the conductive layer within the recess may also result when the conductive layer does not completely fill up the recess. Voids and poor step coverage can cause the integrated circuit to experience an electrical failure. The electrical failure can be experienced during fabrication of the integrated circuit or after a period of time that the integrated circuit has been in use, such as where electrical contact with the conductive layer in the recess has been lost because the material of the conductive layer moves.

It would be an advantage in the art to overcome the problems of poor step coverage and voids.

SUMMARY OF THE INVENTION

In accordance with the invention as embodied and broadly described herein, the present invention relates to the method for manufacturing an interconnect structure situated on a semiconductor wafer having a substrate assembly thereon. A novel interconnect structure is also disclosed. The term substrate assembly is intended herein to mean a substrate having one or more layers or structures formed thereon. As such, the substrate assembly may be, by way of example and not by way of limitation, a doped silicon semiconductor substrate typical of a semiconductor wafer.

The interconnect structure is formed in a dielectric material situated on the substrate assembly of the semiconductor wafer. The novel process forms the dielectric material into a recess having a specified geometry shape. The shape formed in the dielectric material will preferably be a recess therein. The recess can be a trench, a hole, a via, or a combination of a trench and a hole or via. The dielectric shape can be formed by processing the dielectric material by way of dry etching or other recess-creating process.

Following the creation of the dielectric structure in the dielectric material, at least one diffusion barrier layer is formed over the dielectric structure. The diffusion barrier layer is at least partially conformably formed upon the dielectric structure. The material from which the diffussion barrier layer is substantially composed is preferably selected from the group consisting of ceramics, metallics, and intermetallics. More preferably, the diffusion barrier layer is substantially composed of a material that is selected from the group consisting of aluminum nitride, tungsten nitride, titanium nitride, and tantalum nitride.

A seed layer is then formed upon the diffusion barrier layer. The seed layer helps to promote nucleation, deposition, and growth of a material that will be used to fill up the dielectric structure. The seed layer can also serve the purpose of increasing surface mobility of the barrier layer which helps to make a desirable filling of the dielectric structure in the metallization process. Preferably, the material from which the seed layer is substantially composed is selected from the group consisting of ceramics, metallics, and intermetallics. More preferably, the material from which the seed layer is composed is selected from the group consisting of aluminum, titanium nitride, titanium, and titanium aluminide. Additionally and by comparison, the diffusion barrier layer will preferably be composed of a material having a melting point greater than or equal to that of the material from which the seed layer is composed An electrically conductive layer is then formed upon the seed layer. The electrically conductive layer is the current carrier for electrical signals that will communicate with an integrated circuit associated therewith. Preferably, the electrically conductive layer is substantially composed of aluminum or copper. The material from which the diffusion barrier layer is composed will preferably have a melting point greater than that of a material from which the electrically conductive layer is composed. The material from which the seed layer is composed will preferably have a melting point greater than or equal to that of the material from which the electrically conductive layer is composed.

An energy absorbing layer is then formed upon the conductor layer. The energy absorbing layer will preferably have a greater thermal absorption capacity than that of the electrically conductive layer. Alternatively, the energy absorbing layer will preferably being composed of a material having a higher melting point than that of the material from which the electrically conductive layer is composed. As another alternative, the energy absorbing layer will preferably be composed of a material having both a higher thermal insulation capacity and electric insulation capacity than that of the material from which the electrically conductive layer is composed.

The energy absorbing layer is heated to cause the conductor layer to flow so as to fill voids that have formed within the dielectric structure. In conjunction with the heating of the energy absorbing layer, a pressure above atmospheric pressure can be applied to the semiconductor substrate assembly to better assist the process of causing the conductor layer to flow so as to fill voids within the dielectric structure. Preferably, the energy absorbing layer is substantially composed of a material selected from the group consisting of titanium, titanium nitride, tungsten, tungsten nitride, silicon nitride, silicon dioxide, tantalum, tantalum nitride, and carbon.

Following the steps of heating or heating and pressurizing the energy absorbing layer, the energy absorbing layer is removed, preferably by planarizing. The planarizing step may also remove a portion of the conductive layer situated above the dielectric structure.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
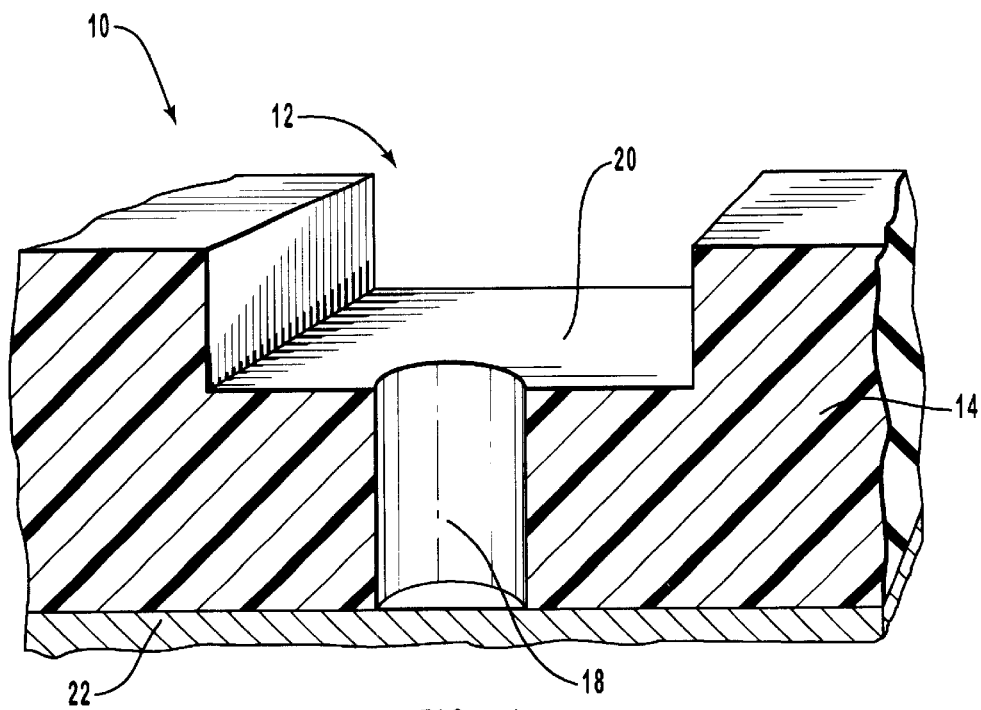
FIG. 1 is a partial cross-sectional elevation and perspective view of a dielectric material that is situated upon a monocrystalline silicon layer of a semiconductor wafer, the dielectric material having a dielectric structure formed therein that is shaped as a recess in the dielectric material, the recess featuring the combination of a hole extending to a trench in the dielectric material, the hole terminating at the monocrystalline silicon layer of the semiconductor wafer.

FIG. 1 depicts a semiconductor substrate assembly 10. A lower substrate known as a silicon layer 22 is formed in semiconductor substrate assembly 10, and a dielectric material 14 is upon silicon layer 22. Lower substrate or silicon layer 22 defines a plane and comprises material selected from the group consisting of silicon dioxide, silicate glass and mixtures or derivatives thereof. A hole 18 having a cylindrical shape extends from silicon layer 22 to terminate at a trench 20 formed in dielectric material 14. Trench 20 is rectangular in cross-section.

Figure 2:
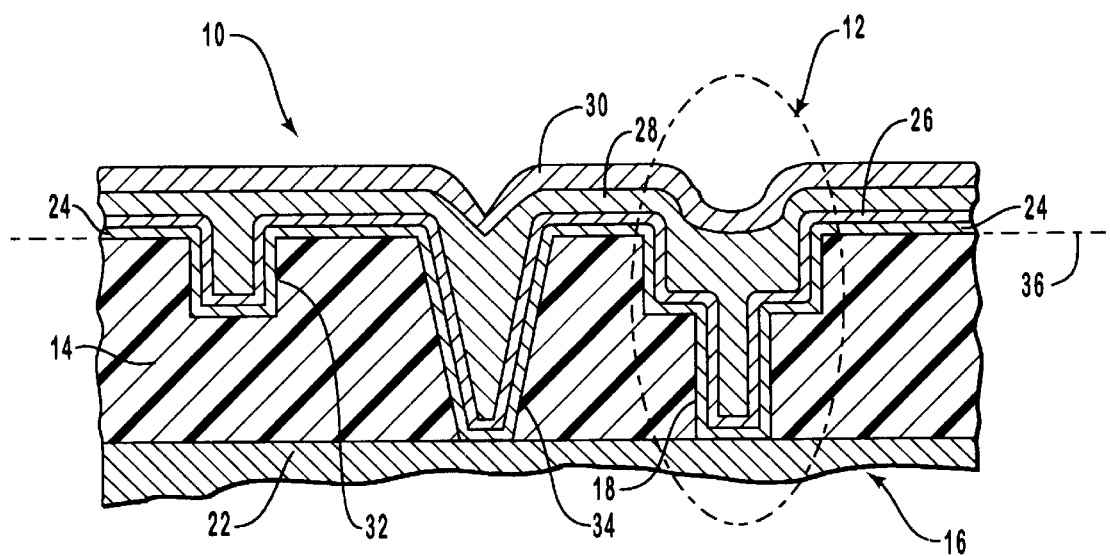
FIG. 2 is a partial perspective cross-sectional elevation view of a portion of FIG. 1, showing various interconnect structure, including a trench in the dielectric material, a hole in the dielectric material, and a combination thereof, each said interconnect structure having thereon one or more layers of each of a barrier layer, a seed layer, a conductive layer, and an energy absorbing layer.

FIG. 2 shows a cross-section 12 seen FIG. 1. Another trench 32, and another hole 34 are also depicted. Trench 32 is not situated over a hole as is trench 20. FIG. 2 also depicts a hole 34 having a triangular cross-section and extending from a top surface of dielectric material 14 to terminate at silicon layer 22. When filed with materials for a metallization process and subsequently planarized, holes 18, 34, and trenches 20, 32 become interconnect structures in the metallization process as described below.

To initiate the metallization process, dielectric material 14 is formed upon silicon layer 22 by conventional processing, such as depositing doped or undoped oxide by various CVD processes, or by TEOS deposition. Next, dielectric material 14 has recesses formed therein, including for example holes 18, 34, and trenches 20, 32, the formation of which is by conventional processing methods such as patterning and etching.

After dielectric material 14 has been processed into the desired configuration of recesses, the next step is to form a barrier layer 24 over the dielectric structure 12. Barrier layer 24 may be formed, by way of example and not by way of limitation, by multiple deposition of a material. The material from which barrier layer 24 is composed preferably will act as an adhesion layer for materials formed thereon, and also will acts as a diffusion barrier to prevent the diffusion of material through barrier layer 24.

Barrier layer 24 will preferably be a substantially continuous coating of material over the recesses in dielectric material 14. Barrier layer 24 may be comprised of refractory metals or nitrides thereof, such as titanium, tungsten, tantalum, titanium nitride, tungsten nitride, or tantalum nitride. Typically, barrier layer 24 is titanium and/or titanium nitride together. Barrier layer 24 can be particularly important in the areas where holes 18, 34 extend past dielectric material 14 to terminate at silicon layer 22.

The next step, which may be desirable in the inventive method depending upon the composition of materials used to fill the recesses in dielectric material 14, is to thermally process barrier layer 24. The thermal processing of barrier layer 24 helps to improve electrical contact of the interconnect structures being formed. For example, if titanium is deposited, then it is desirable that a thermal process be performed. The thermal process would preferably be beating the semiconductor substrate assembly in a nitrogen environment at a selected temperature at which nitrides are formed on the surface of the titanium. If barrier layer 24 comprises titanium or titanium nitride, argon may be used as the environment for thermal processing. In this example, titanium exposed to the nitrogen environment would form titanium nitride and exposed silicon would form silicon nitride. As the thermal process heats the semiconductor substrate assembly, titanium silicide would form so as to create a desirable contact resistance with silicon layer 22.

A seed layer 26 is formed over barrier layer 24 in the next step of the inventive method, The type of material used as seed layer 26 is dependant upon subsequent processing. If some type of subsequent reflow process is needed for later added layers, or even a CVD process is going to be used for the formation of seed layer 26, seed layer 26 will preferably be formed prior to subsequent processing so as to clean barrier layer 24. The use of seed layer 26 provides a surface on barrier layer 24 that is substantially free of contaminates that may interfere with surface diffusion. Seed layer 26 promotes the deposition and growth of a layer of material that will be formed thereon. Additionally, seed layer 26 will preferably be the main conductor for current in the interconnect structure and will promote surface mobility of materials formed thereon so as to fill the recesses in dielectric material 14 is a desirable manner.

By way of example of materials and processes for formation of seed layer 26, a CVD tungsten process can be used. When so processed there will be a nucleation of seed layer 26 that will be rich in both silicon and hydrogen, initially. The CVD tungsten process will then preferably undergo a chemistry change in the middle thereof so as to become rich in hexflouride such that a more pure form of tungsten material makes up seed layer 26. Those of ordinary skill in the art will understand the selection of proper seed layer 26 compositions, which selection may be done empirically utilizing chemical potential differences and differences in diffusion characteristics of materials.

The seed layer may also be made of titanium nitride, which is preferred when aluminum is used in the interconnect structures. If so, the seed layer should be deposited in situ prior to filling the interconnect structures with aluminum so as to enable the aluminum to freely flow and to avoid binding up the flow of the aluminum. Multiple layers can be used to make up the seed layer, which multiple layers will preferably be deposited in a vacuum system and will be composed, for example, of both titanium nitride and/or silicon.

The next step in the inventive method is the formation of a conductor layer 28. Conductor layer 28 will preferably be composed of typical metallization conductor materials. For example, if a reflow or a fill process with aluminum process is going to be used, then an aluminum and high pressure fill would be used to substantially cover seed layer 26 in the recesses within dielectric material 14. The composition of conductor layer 28 may depend on the aspect ratio of the recesses within dielectric material 14. Aspect ratios below four (4) may not require a high pressure fill of the recesses. Another example of a conductor material is copper.

When aluminum is used as conductor layer 28, the composition of barrier layer 24 will preferably be selected to avoid a heat induced reaction of aluminum with silicon in silicon layer 22 so as to form tetrahedrons in the silicon, wherein by a detrimental effect is realized.

An energy absorbing layer 30 is then formed, preferably by deposition, upon conductor layer 28. Energy absorbing layer 30 retains thermal energy and comprises a material that has a lower thermal conductivity than conductor layer 28. By way of example and not limitation, if conductor layer 28 is composed of aluminum and energy absorbing layer 30 is composed of tungsten, the tungsten has a higher melting point that aluminum. This results in the tungsten retaining more energy.

From a spectral point of view, if aluminum is used as conductor layer 28 and depending how the aluminum layer is deposited, it is possible to obtain something that is not as spectrally reflective. A preferable characteristic of energy absorbing layer 30 is that it must be able to absorb more energy than the material that is used as conductor layer 28. The purpose behind this requirement is that when challenging structures (e.g. recesses in dielectric material 14 having aspect ratios greater than four (4) to one (1) are being formed which are to be filled with a conductor, the conductor will flow more freely to fill a recess when thermal energy is retained within the conductor by a layer thereon that will better retain such thermal energy. As such, the flowablility of the conductor is enhanced so that diffusion thereof into the recess is bettered.

Enhancing the diffusion characteristics of the material of the conductor is achieved by either volume diffusion or surface diffusion, each of which are time and temperature dependent. The temperature of the conductor is held high for at a longer period of time while underlying or overlying materials retain thermal energy. The formation of energy absorbing layer 30 on conductor layer 28 substantially retains thermal energy under an interfacial surface of energy absorbing layer 30 so that the thermal energy can diffuse into conductor layer 28.

By way of example, if conductor layer 28 is aluminum, energy absorbing layer 30 can be titanium nitride, tungsten, or even a dielectric substance. A layer of titanium nitride is less thermally conductive than aluminum. If conductor layer 28 is copper, examples of energy absorbing layers 30 are tungsten, titanium nitride, tantalum or carbon.

The next step of the inventive method is to apply energy to energy absorbing layer 30. The energy that is applied to energy absorbing layer 30 is transmitted to conductor layer 28. Conductor layer 28 is then able to flow and fill voids that have formed in recesses within dielectric material 14. With the voids removed, desirable step coverage of the recesses within dielectric material 14, and desirable fill of the recesses is achieved. Examples of ways to apply energy to energy absorbing layer 30 include, but are not limited to, lasers, tube furnaces, RTP or other kinds of radiant or thermal energy. Preferably, energy absorbing layer 30 will be heated.

A preferable step that follows the forgoing steps is the removal of materials from the semiconductor substrate assembly by an abrasive planarizing process, for example, chemical mechanical planarizing. Material will be removed during the planarizing process until planarization line 36 seen in FIG. 2 is reached. The resulting interconnect structures have been metallized so as to be buried within dielectric material 14, and as such can be considered to be a metallization by "wire-down" technology. Subsequent and conventional processing can then following in the fabrication processing of the semiconductor substrate assembly.

FIG. 2 shows a novel dual damascene structure depicted as hole 18 and trench 20 filled with each of barrier layer 24, seed layer 26, and conductor layer 28, where trench 20 has been planarized at planarization line 36. Planarization line 36 makes the metallization in an "inlaid" form. The two or "dual" metallization damescene structure is seen in the inlaid combination of both hole 18 and trench 20.

The disclosed novel method is capable of desirable step coverage and being capable of filling in a recess within a dielectric material having an aspect ratio greater than about four (4) to one (1). As such, the novel process improves both the yield and reliability over conventional processes.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An interconnect structure, comprising:
   a dielectric material over a semiconductor substrate and having a top surface;
   a recess within the dielectric material extending from the top surface of the dielectric material to the semiconductor substrate and being filled with a fill material, wherein:
      the recess includes:
         a first portion having a uniform width and extending from within the dielectric material to the top surface of the dielectric material;
         a second portion extending from the semiconductor substrate to terminate at the first portion and having a height and a uniform width, wherein the uniform width of the second portion:
            is less than the width of the first portion; and
            is not greater than 25% of the height of the second portion;
      the fill material includes:
         a thermally flowed conductor layer within the recess resulting from thermally-induced flow of metallization conductor material into said recess;
         an energy absorbing layer for causing the conductor layer to flow into the recess upon application of a thermal load to the energy absorbing layer, thus filling voids within the dielectric material recess, the energy absorbing layer being upon the conductor layer and having an upper surface that extends towards the recess when immediately over the recess, wherein the energy absorbing layer with respect to the conductor layer:
            is a better thermal insulator; and
            is less electrically conductive;
         a thermally treated diffusion barrier layer in contact with said semiconductor substrate and the dielectric material; and
         a seed layer upon said thermally treated diffusion barrier layer, wherein said seed layer is in contact with said thermally flowed conductor layer, and said seed layer comprises a material selected from the group consisting of ceramics, metallics, and intermetallics, wherein said thermally flowed conductor layer is upon the seed layer, wherein said conductor layer has a first melting point temperature, said seed layer has a second melting point temperature, and said diffusion barrier layer has a third melting point temperature, and wherein said third melting point temperature is higher than said second melting point temperature, and said second melting point temperature is higher than said first melting point temperature.

2. The interconnect structure as defined in claim 1, wherein the first portion is a trench having a bottom surface that extends longitudinally parallel to the top surface of the dielectric material, and the second portion has a contact plug therein.

3. The interconnect structure as defined in claim 1, wherein said seed layer is a multi-layer structure.

4. The interconnect structure as defined in claim 1, wherein said thermally treated diffusion barrier layer comprises the thermal treatment reaction products of said barrier layer and said semiconductor substrate.

5. The interconnect structure as defined in claim 1, wherein said thermally treated diffusion barrier layer comprises a material selected from the group consisting of aluminum nitride, tungsten nitride, titanium nitride, and tantalum nitride.

6. The interconnect structure as defined in claim 1, wherein the seed layer comprises a material selected from the group consisting of aluminum, titanium nitride, titanium, and titanium aluminide.

7. An interconnect structure as defined in claim 1, wherein the conductor layer comprises a material selected from the group consisting of aluminum and copper.

8. An interconnect structure as defined in claim 1, wherein the energy absorbing layer comprises a material selected from the group consisting of titanium, titanium nitride, tungsten, tungsten nitride, silicon nitride, silicon dioxide, tantalum, tantalum nitride, and carbon.

9. The interconnect structure as defined in claim 1, wherein:
    the energy absorbing layer has a first part that is immediately over the recess and a second part that is not immediately over the recess;
    the top surface of the energy absorbing layer in the first part is non-planar; and
    the top surface of the energy absorbing layer in the second part is planar.

10. The interconnect structure as defined in claim 1, wherein the upper surface of the energy absorbing layer immediately over the recess is non-planar and the upper surface of the energy absorbing layer not immediately over the recess is planar.

11. The interconnect structure as defined in claim 1, wherein the upper surface of the energy absorbing layer extends towards but not into the recess when immediately over the recess.

12. The interconnect structure as defined in claim 1, wherein:
    the thermally flowed conductor layer has a top surface;
    the recess has a top surface; and
    the top surface of the thermally flowed conductor layer is continuously above the top surface of the recess.

13. The interconnect structure as defined in claim 1, wherein the energy absorbing layer does not contact the dielectric material.

14. The interconnect structure as defined in claim 1, wherein the energy absorbing layer comprises an electrical insulation material.

15. An interconnect structure, comprising:
    a lower substrate situated on a semiconductor substrate assembly, said lower substrate defining a plane;
    a dielectric material on the lower substrate, said dielectric material having a planar top surface;
    a recess within said dielectric material, said recess including a contact hole situated below a trench, said contact hole terminating at an end thereof at the lower substrate and terminating at an opposite end thereof at said trench, said contact hole being oriented perpendicular to the plane of said lower substrate, said trench extending from said opposite end of said contact hole to a top surface of said dielectric material, the trench extending parallel to the plane of said lower substrate; and
    a fill layer situated within and filling both the contact hole and the trench and extending to terminate above the planar top surface of the dielectric material, wherein the fill layer includes:
        a thermally flowed conductor layer within the recess resulting from thermally-induced flow of metallization conductor material into said recess, wherein said thermally flowed conductor layer has a first melting point temperature; and
        an energy absorbing layer for causing the conductor layer to flow into the recess upon application of a thermal load to the energy absorbing layer, thus filling voids within the dielectric material recess, the energy absorbing layer being upon the conductor layer and having an upper surface that extends towards the recess when immediately over the recess, wherein the energy absorbing layer with respect to the conductor layer:
            is a better thermal insulator; and
            is less electrically conductive;
        a thermally treated diffusion barrier layer in contact with said lower substrate and said dielectric material, wherein said thermally treated diffusion barrier layer has a third melting point temperature and comprises a contact resistance formed in contact with said semiconductor substrate; and
        a seed layer upon the diffusion layer, wherein said seed layer is in contact with and below said thermally flowed conductor layer, and said seed layer comprises a material selected from the group consisting of ceramics, metallics, and intermetallics, wherein said seed layer has a second melting point temperature, and wherein said third melting point temperature is higher than said second melting point temperature, and said second melting point temperature is higher than said first melting point temperature.

16. The interconnect structure as defined in claim 15, wherein said seed layer is a multi-layer structure and wherein said thermally processed diffusion barrier comprises the thermal treatment reaction products of said barrier layer and said lower substrate.

17. The interconnect structure as defined in claim 16, wherein the contact hole:
    has a height; and
    has a width that is not greater than four times the height of the contact hole.

18. The interconnect structure as defined in claim 15, wherein:
    the energy absorbing layer has a first part that is immediately over the recess and a second part that is not immediately over the recess;
    the top surface of the energy absorbing layer in the first part is non-planar; and
    the top surface of the energy absorbing layer in the second part is planar.

19. The interconnect structure as defined in claim 15, wherein the upper surface of the energy absorbing layer immediately over the recess is non-planar and the upper surface of the energy absorbing layer not immediately over the recess is planar.

20. The interconnect structure as defined in claim 15, wherein the upper surface of the energy absorbing layer extends towards but not into the recess when immediately over the recess.

21. The interconnect structure as defined in claim 15, wherein:
   the conductor layer has a top surface;
   the recess has a top surface; and
   the top surface of the conductor layer is continuously above the top surface of the recess.

22. The interconnect structure as defined in claim 15, wherein the energy absorbing layer does not contact the dielectric material.

23. The interconnect structure as defined in claim 15, wherein the energy absorbing layer comprises an electrical insulation material.

24. An interconnect structure, comprising:
   a lower substrate situated on a semiconductor substrate assembly, said lower substrate defining a plane;
   a dielectric material on the lower substrate having a planar top surface;
   a recess within said dielectric material, said recess including a contact hole situated below a trench, said contact hole terminating at an end thereof at the lower substrate and terminating at an opposite end thereof at said trench, said contact hole being oriented perpendicular to the plane of said lower substrate, said trench extending from said opposite end of said contact hole to the planar top surface of said dielectric material, the trench extending parallel to the plane defined by said lower substrate;
   a thermally treated diffusion barrier layer in the trench and within the contact hole, wherein said thermally treated diffusion barrier layer comprises a contact resistance formed in contact with said lower substrate;
   a seed layer on the thermally treated diffusion barrier layer, the diffusion barrier layer;
   a thermally flowed electrically conductive layer resulting from thermally-induced flow of metallization conductor material into said recess, said thermally flowed electrically conductive layer being on the seed layer and extending to terminate above the planar top surface of the dielectric material, the diffusion barrier layer having a melting point greater than that of the electrically conductive layer, and the seed layer having a melting point greater than that of the thermally flowed electrically conductive layer; and
   an energy absorbing layer for causing the conductor layer to flow into the recess upon application of a thermal load to the energy absorbing layer, thus filling voids within the dielectric material recess, the energy absorbing layer being upon the thermally flowed electrically conductive layer and having an upper surface that extends towards the recess when immediately over the recess, wherein the energy absorbing layer with respect to the electrically conductive layer:
     is a better thermal insulator; and
     is less electrically conductive.

25. An interconnect structure as defined in claim 24, wherein the diffusion barrier layer comprises a material selected from the group consisting of aluminum nitride, tungsten nitride, titanium nitride, and tantalum nitride.

26. An interconnect structure as defined in claim 24, wherein the seed layer comprises a material selected from the group consisting of aluminum, titanium nitride, titanium, and titanium aluminide.

27. An interconnect structure as defined in claim 24, wherein the electrically conductive layer comprises a material selected from the group consisting of aluminum and copper.

28. The interconnect structure as defined in claim 24, wherein the contact hole:
   has a height; and
   has a width that is not greater than four times the height of the contact hole.

29. The interconnect structure as defined in claim 24, wherein:
   the energy absorbing layer has a first part that is immediately over the recess and a second part that is not immediately over the recess;
   the top surface of the energy absorbing layer in the first part is non-planar; and
   the top surface of the energy absorbing layer in the second part is planar.

30. The interconnect structure as defined in claim 24, wherein the upper surface of the energy absorbing layer immediately over the recess is non-planar and the upper surface of the energy absorbing layer not immediately over the recess is planar.

31. The interconnect structure as defined in claim 24, wherein the upper surface of the energy absorbing layer extends towards but not into the recess when immediately over the recess.

32. The interconnect structure as defined in claim 24, wherein:
   the electrically conductive layer has a top surface;
   the recess has a top surface; and
   the top surface of the electrically conductive layer is continuously above the top surface of the recess.

33. The interconnect structure as defined in claim 24, wherein the energy absorbing layer does not contact the dielectric material.

34. The interconnect structure as defined in claim 24, wherein the energy absorbing layer comprises an electrical insulation material.

35. An interconnect structure, comprising:
   a monocrystalline silicon layer in a semiconductor substrate assembly, said monocrystalline silicon layer defining a plane;
   a dielectric material on the monocrystalline silicon layer;
   a recess within said dielectric material, said recess including a contact hole situated below a trench, said contact hole terminating at an end thereof at the silicon layer and terminating at an opposite end thereof at said trench, said contact hole being oriented perpendicular to the plane of said monocrystalline silicon layer, said trench extending from said opposite end of said contact hole to a top surface of said dielectric material, the trench extending parallel to the plane of said monocrystalline silicon layer;
   a thermally treated diffusion barrier layer in the trench and within the contact hole, the thermally treated diffusion barrier layer comprising a material selected from the group consisting of aluminum nitride, tungsten nitride, titanium nitride, and tantalum nitride, wherein said thermally treated diffusion barrier layer comprises a contact resistance formed in contact with said monocrystalline silicon layer;
   a seed layer on said thermally treated diffusion barrier layer, the seed layer comprising a material selected from the group consisting of aluminum, titanium nitride, titanium, and titanium aluminide, the diffusion barrier layer having a melting point greater than that of the seed layer;
   a thermally flowed electrically conductive layer resulting from thermally-induced flow of metallization conductor material into said recess, wherein said thermally flowed electrically conductive layer is disposed on the seed layer and extending to terminate above the planar surface of the dielectric material, the material from which the thermally treated diffusion barrier layer having a melting point greater than that of the thermally flowed electrically conductive layer, the seed layer having a melting point greater than or equal to that of the thermally flowed electrically conductive layer, the thermally flowed electrically conductive layer comprising a material selected from the group consisting of aluminum and copper; and an energy absorbing layer for causing the conductor layer to flow into the recess upon application of a thermal load to the energy absorbing layer, thus filling voids within the dielectric material recess, the energy absorbing layer being upon the thermally flowed electrically conductive layer and having an upper surface that extends towards the recess when immediately over the recess, wherein the energy absorbing layer with respect to the thermally flowed electrically conductive layer:
is a better thermal insulator; and
is less electrically conductive.

36. An interconnect structure recited in claim 35, wherein the contact hole has an aspect ratio greater than about 4 to 1.

37. The interconnect structure as defined in claim 35, wherein:
the energy absorbing layer has a first part that is immediately over the recess and a second part that is not immediately over the recess;
the top surface of the energy absorbing layer in the first part is non-planar; and
the top surface of the energy absorbing layer in the second part is planar.

38. The interconnect structure as defined in claim 35, wherein the upper surface of the energy absorbing layer immediately over the recess is non-planar and the upper surface of the energy absorbing layer not immediately over the recess is planar.

39. The interconnect structure as defined in claim 35, wherein the upper surface of the energy absorbing layer extends towards but not into the recess when immediately over the recess.

40. The interconnect structure as defined in claim 35, wherein:
the electrically conductive layer has a top surface;
the recess has a top surface; and
the top surface of the electrically conductive layer is continuously above the top surface of the recess.

41. The interconnect structure as defined in claim 35, wherein the energy absorbing layer does not contact the dielectric material.

42. The interconnect structure as defined in claim 35, wherein the energy absorbing layer comprises an electrical insulation material.

43. An interconnect structure, comprising:
a semiconductor substrate;
a dielectric first material upon the semiconductor substrate and having a top surface, the first material having a recess therein of discontinuously varying width, the recess extending from the semiconductor substrate to the top surface of the first material;
a second material filling the recess, the second material including a thermally flowed conductor layer resulting from thermally-induced flow of metallization conductor material into said recess, and an energy absorbing layer for causing the conductor layer to flow into the recess upon application of a thermal load to the energy absorbing layer, thus filling voids within the dielectric material recess, the energy absorbing layer overlying the conductor layer that subsides when immediately over the recess, wherein the energy absorbing layer is more thermally and electrically insulative than the conductor layer, and no portion of the energy absorbing layer is formed so that it would be both below the conductor layer and in contact with the dielectric first material;
a thermally treated diffusion barrier layer in contact with said semiconductor substrate and the dielectric first material; and
a seed layer upon said thermally treated diffusion barrier layer, wherein said seed layer is in contact with said thermally flowed conductor layer, and said seed layer comprises a material selected from the group consisting of ceramics, metallics, and intermetallics, wherein said thermally flowed conductor layer is upon the seed layer, wherein said conductor layer has a first melting point temperature, said seed layer has a second melting point temperature, and said diffusion barrier layer has a third melting point temperature, and wherein said third melting point temperature is higher than said second melting point temperature, and said second melting point temperature is higher than said first melting point temperature.

44. The interconnect structure as defined in claim 43, wherein the energy absorbing layer does not contact the first material.

45. The interconnect structure as defined in claim 43, wherein:
the conductor layer is electrically conductive; and
the energy absorbing layer is electrical insulative.

46. The interconnect structure as defined in claim 43, wherein the recess includes a contact hole extending from the semiconductor substrate to a trench, the trench extending from the contact hole to the top surface of the first material.

* * * * *

UNITED STATES PATENT AND TRADEMARK OFFICE
CERTIFICATE OF CORRECTION

PATENT NO. : 6,404,053 B2  Page 1 of 1
DATED : June 11, 2002
INVENTOR(S) : John H. Givens It is certified that error appears in the above-identified patent and that said Letters Patent is hereby corrected as shown below:

Column 1,
Line 29, change "wring" to -- wiring --

Column 2,
Line 40, change "being" to -- be --

Column 4,
Line 8, change "beating" to -- heating --
Line 19, after "method" change "," to -- . --
Line 33, change "is" to -- in --

Column 5,
Line 10, change "that" to -- than --
Line 30, delete "at"
Line 62, change "following" to -- follow --

Column 6,
Line 11, change "illustrated" to -- illustrative --

Signed and Sealed this

Fourth Day of February, 2003

JAMES E. ROGAN
*Director of the United States Patent and Trademark Office*